(12) United States Patent
Wada et al.

(10) Patent No.: US 8,969,993 B2
(45) Date of Patent: Mar. 3, 2015

(54) WIDE GAP SEMICONDUCTOR DEVICE AND METHOD FOR MANUFACTURING SAME

(71) Applicant: Sumitomo Electric Industries, Ltd., Osaka-shi (JP)

(72) Inventors: Keiji Wada, Osaka (JP); Takeyoshi Masuda, Osaka (JP); Toru Hiyoshi, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 13/950,698

(22) Filed: Jul. 25, 2013

(65) Prior Publication Data

US 2014/0061671 A1 Mar. 6, 2014

Related U.S. Application Data

(60) Provisional application No. 61/697,679, filed on Sep. 6, 2012.

(30) Foreign Application Priority Data

Sep. 6, 2012 (JP) ................................ 2012-195796

(51) Int. Cl.
| | |
|---|---|
| *H01L 27/095* | (2006.01) |
| *H01L 29/47* | (2006.01) |
| *H01L 29/812* | (2006.01) |
| *H01L 31/07* | (2012.01) |

(Continued)

(52) U.S. Cl.
CPC ........ *H01L 29/872* (2013.01); *H01L 29/66143* (2013.01); *H01L 29/6603* (2013.01);

(Continued)

(58) Field of Classification Search
CPC .............. H01L 29/872; H01L 29/7806; H01L 29/66143
USPC ............ 257/E29.338, E21.359, 77, 471, 472, 257/473, 476

See application file for complete search history.

(56) References Cited

U.S. PATENT DOCUMENTS 6,404,033 B1 * 6/2002 Chang et al. .................. 257/484
6,501,145 B1 12/2002 Kaminski et al.

(Continued)

FOREIGN PATENT DOCUMENTS

| JP | 2000-294804 A | 10/2000 |
|---|---|---|
| JP | 2001-085704 A | 3/2001 |

(Continued)

OTHER PUBLICATIONS

International Search Report and Written Opinion in PCT International Application No. PCT/JP2013/068710, dated Sep. 17, 2013.

*Primary Examiner* — Thien F Tran
(74) *Attorney, Agent, or Firm* — Venable LLP; Michael A. Sartori

(57) ABSTRACT

A wide gap semiconductor device includes a substrate and a Schottky electrode. The substrate formed of a wide gap semiconductor material has a main face, and includes a first-conductivity-type region and a second-conductivity-type region. The Schottky electrode is arranged adjoining the main face of the substrate. At the substrate, there is foamed a trench having a side face continuous with the main face and a bottom continuous with the side face. The Schottky electrode adjoins the first-conductivity-type region at the side face of the trench and the main face, and adjoins the second-conductivity-type region at the bottom of the trench. The side face of the trench is inclined relative to the main face of the substrate.

5 Claims, 11 Drawing Sheets

(51) Int. Cl.
*H01L 31/108* (2006.01)
*H01L 29/872* (2006.01)
*H01L 29/66* (2006.01)
*H01L 29/06* (2006.01)
*H01L 29/16* (2006.01)
*H01L 29/20* (2006.01)

(52) U.S. Cl.
CPC ...... *H01L29/6606* (2013.01); *H01L 29/66212* (2013.01); *H01L 29/0623* (2013.01); *H01L 29/0619* (2013.01); *H01L 29/1602* (2013.01); *H01L 29/1608* (2013.01); *H01L 29/2003* (2013.01)
USPC ............. 257/471; 257/77; 257/472; 257/473; 257/476; 257/E29.338; 257/E21.359

(56) References Cited

U.S. PATENT DOCUMENTS

2008/0032880 A1  2/2008  Maruyama et al.
2009/0008651 A1  1/2009  Okuno et al.
2012/0256195 A1*  10/2012  Aketa ............................. 257/77

FOREIGN PATENT DOCUMENTS

| JP | 2002-508888 A | 3/2002 |
| JP | 2009-016603 A | 1/2009 |
| JP | 2010-206012 A | 9/2010 |
| JP | 2011-142355 A | 7/2011 |
| WO | WO-2005/116307 A1 | 12/2005 |

* cited by examiner

WIDE GAP SEMICONDUCTOR DEVICE AND METHOD FOR MANUFACTURING SAME

BACKGROUND OF THE INVENTION

1. Field of the Invention

The present invention relates to a wide gap semiconductor device, and a method for manufacturing a wide gap semiconductor device. More particularly, the present invention relates to a wide gap semiconductor device that can alleviate the electric field at the interface between a Schottky electrode and a substrate, and a method for manufacturing such a wide gap semiconductor device.

2. Description of the Background Art

Semiconductor devices such as a Schottky barrier diode (SBD) and junction barrier Schottky diode (JBS) have a configuration in which a Schottky electrode is formed on a substrate. Since the work function difference between metal qualified as the electrode material and semiconductor is small in a Schottky barrier diode, the leakage current during application of reverse voltage readily becomes great as compared to that of a PN diode. Therefore, various configurations are proposed in order to reduce leakage current.

For example, Japanese Patent Laying-Open No. 2001-85704 discloses a silicon carbide Schottky diode including a $p^+$ guard ring region formed at the region of the substrate adjoining a perimeter region of the Schottky electrode, having a pn junction developed in contact with the main surface of the substrate. Further, Japanese Patent Laying-Open No. 2009-16603 discloses a junction barrier Schottky diode having a plurality of p type layers formed concentrically at a substrate adjoining a Schottky electrode.

SUMMARY OF THE INVENTION

However, it was difficult to sufficiently reduce the electric field at the interface between the Schottky electrode and substrate in the Schottky diodes disclosed in Japanese Patent Laying-Open No. 2001-85704 and Japanese Patent Laying-Open No. 2009-16603.

In view of the foregoing, an object of the present invention is to provide a wide gap semiconductor device that can effectively alleviate the electric field at the interface between a Schottky electrode and substrate, and a method for manufacturing such a wide gap semiconductor device.

A wide gap semiconductor device according to the present invention includes a substrate, and a Schottky electrode. The substrate formed of a wide gap semiconductor material has a main face, and includes a first-conductivity-type region and a second-conductivity-type region. The Schottky electrode is arranged adjoining the main face of the substrate. At the substrate, a trench is formed, having a side face continuous with the main face and a bottom continuous with the side face. The Schottky electrode adjoins the first-conductivity-type region at the side face of the trench and the main face, and adjoins the second-conductivity-type region at the bottom of the trench. The side face of the trench is inclined relative to the main face of the substrate. As used herein, a wide gap semiconductor material implies a semiconductor material having a band gap greater than that of silicon.

According to the wide gap semiconductor device of the present invention, the Schottky electrode adjoins the first-conductivity-type region at the side face of the trench and the main face, and adjoins the second-conductivity-type region at the bottom of the trench. Accordingly, by increasing the electric field at the interface between the second-conductivity-type region and first-conductivity-type region during application of backward voltage, the electric field at the interface between the Schottky electrode and the first-conductivity-type region can be alleviated.

According to the wide gap semiconductor device of the present invention, the side face of the trench is inclined relative to the main face of the substrate. Accordingly, the area of contact between the Schottky electrode and first-conductivity-type region can be increased, as compared to the case where the side face of the trench is parallel to the main face of the substrate. As a result, a current path can be ensured since the surface utilization percentage of electron emission is increased during application of forward voltage.

In the wide gap semiconductor device set forth above, the wide gap semiconductor material is preferably silicon carbide. Accordingly, a wide gap semiconductor device having high breakdown voltage can be obtained.

In the wide gap semiconductor device set forth above, the angle of the main face relative to the side face is greater than or equal to 50° and less than or equal to 85°. In the case where the angle of the main face relative to the side face is smaller than 50°, the effect of alleviating the electric field at the interface between the Schottky electrode and first-conductivity-type region becomes smaller. In the case where the angle of the main face relative to the side face is greater than 85°, a sufficient current path cannot be ensured. By setting the angle of the main face relative to the side face greater than or equal to 50° and less than or equal to 85°, the effect of alleviating the electric field at the interface between the Schottky electrode and first-conductivity-type region can be improved and a sufficient current path can be ensured.

In the wide gap semiconductor device set forth above, the trench includes a first trench and a second trench adjacent to each other. The second-conductivity-type region includes a first second-conductivity-type region adjoining the bottom of the first trench, a second second-conductivity-type region adjoining the bottom of the second trench, and a third second-conductivity-type region arranged between the first second-conductivity-type region and the second second-conductivity-type region. Accordingly, the electric field at the interface between the Schottky electrode and the first-conductivity-type region can be alleviated effectively even in the case where the distance between the first trench and the second trench cannot be reduced.

Preferably in the wide gap semiconductor device set forth above, the substrate includes a fourth second-conductivity-type region adjoining an outer circumference of the Schottky electrode. Accordingly, electric field concentration at the outer circumference of the Schottky electrode can be alleviated.

A method for manufacturing a wide gap semiconductor device according to the present invention includes the following steps. A substrate formed of a wide gap semiconductor material, having a main face and including a first-conductivity-type region and a second-conductivity-type region, is prepared. At the main face of the substrate, a trench is formed, having a side face continuous with the main face and a bottom continuous with the side face. A Schottky electrode is formed, adjoining the first-conductivity-type region at the main face of the substrate and the side face of the trench, and adjoining the second-conductivity-type region at the bottom of the trench. In the step of forming a trench, the side face of the trench is formed inclined relative to the main face of the substrate.

According to the method for manufacturing a wide gap semiconductor device according to the present invention, there is manufactured a wide gap semiconductor device having a Schottky electrode adjoining the first-conductivity-type region at the side face of the trench and the main face, and adjoining the second-conductivity-type region at the bottom of the trench. Accordingly, by increasing the electric field of the second-conductivity-type region during application of backward voltage, the electric field at the interface between the Schottky electrode and the first-conductivity-type region can be alleviated.

According to a method for manufacturing a wide gap semiconductor device according to the present invention, there is manufactured a wide gap semiconductor device having the side face of the trench inclined relative to the main face of the substrate. Accordingly, the area of contact between the Schottky electrode and the first-conductivity-type region can be increased as compared to the case where the side face of the trench is parallel to the main face of the substrate. As a result, a current path can be ensured since the surface utilization percentage of electron emission during application of forward voltage is increased.

Preferably in the method for manufacturing a wide gap semiconductor device set forth above, the step of forming a trench is performed by thermal etching. Accordingly, the damage at the side face of the trench can be eliminated.

According to the present invention, there can be provided a wide gap semiconductor device allowing the electric field at the interface between a Schottky electrode and substrate to be alleviated effectively, and a method for manufacturing the wide gap semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
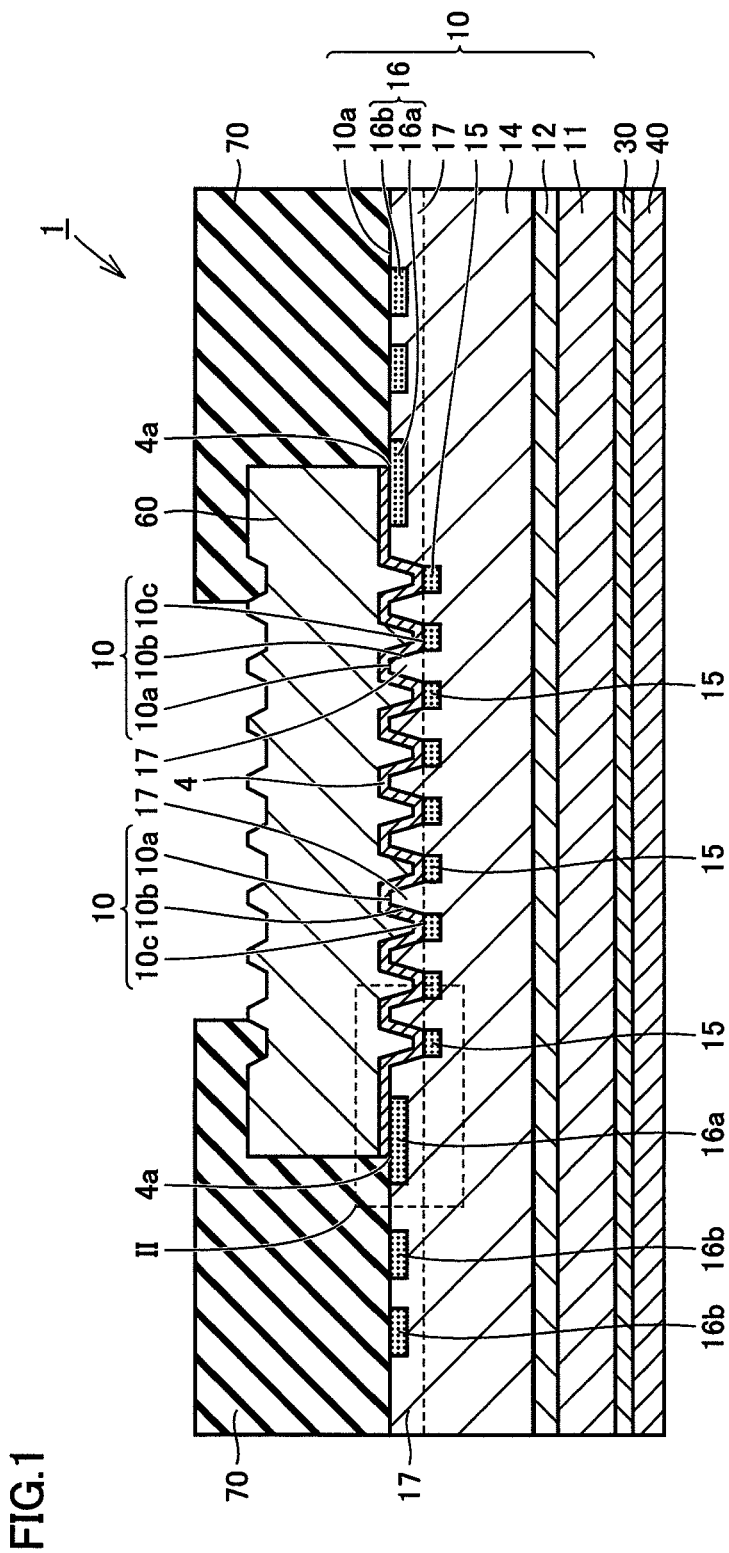
FIG. 1 is a sectional view schematically representing a configuration of a wide gap semiconductor device according to a first embodiment of the present invention.

Embodiments of the present invention will be described hereinafter based on the drawings. In the drawings, the same or corresponding elements have the same reference characters allotted, and description thereof will not be repeated.

[First Embodiment]

First, a configuration of a Schottky barrier diode 1 that is a wide gap semiconductor device according to a first embodiment of the present invention will be described with reference to FIG. 1. As shown in FIG. 1, Schottky barrier diode 1 of the present embodiment mainly includes a substrate 10, a Schottky electrode 4, and an ohmic electrode 30. Substrate 10 is formed of a wide gap semiconductor material, and has a main face 10a. The wide gap semiconductor material refers to a semiconductor material having a band gap greater than that of silicon. Specifically, silicon carbide, gallium nitride, and diamond can be cited as the wide gap semiconductor material.

Substrate 10 includes an $n^+$ substrate 11, an electric field termination layer 12, an n type region 17, a junction termination extension (JTE) region 16, and a p type region 15. $N^+$ substrate 11 corresponds to a substrate formed of single crystal silicon carbide, containing impurities such as nitrogen (N). The impurity concentration of the $n^+$ substrate is approximately $5 \times 10^{18}$ $cm^{-3}$, for example. The impurity concentration of nitrogen or the like included in electric field termination layer 12 is approximately greater than or equal to $5 \times 10^{17}$ $cm^{-3}$ and less than or equal to approximately $1 \times 10^{18}$ $cm^{-3}$. The impurity concentration of nitrogen or the like in n type region 17 is $1 \times 10^{16}$ $cm^{-3}$, for example. The impurity concentration of aluminium or the like in p type region 15 is approximately $1 \times 10^{19}$ $cm^{-3}$, for example.

Figure 2:
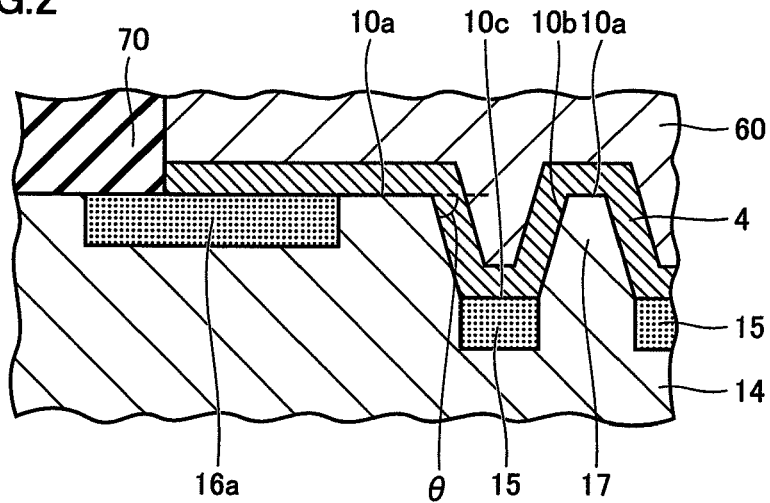
FIG. 2 is an enlarged view of a region II in FIG. 1.
Figure 8:
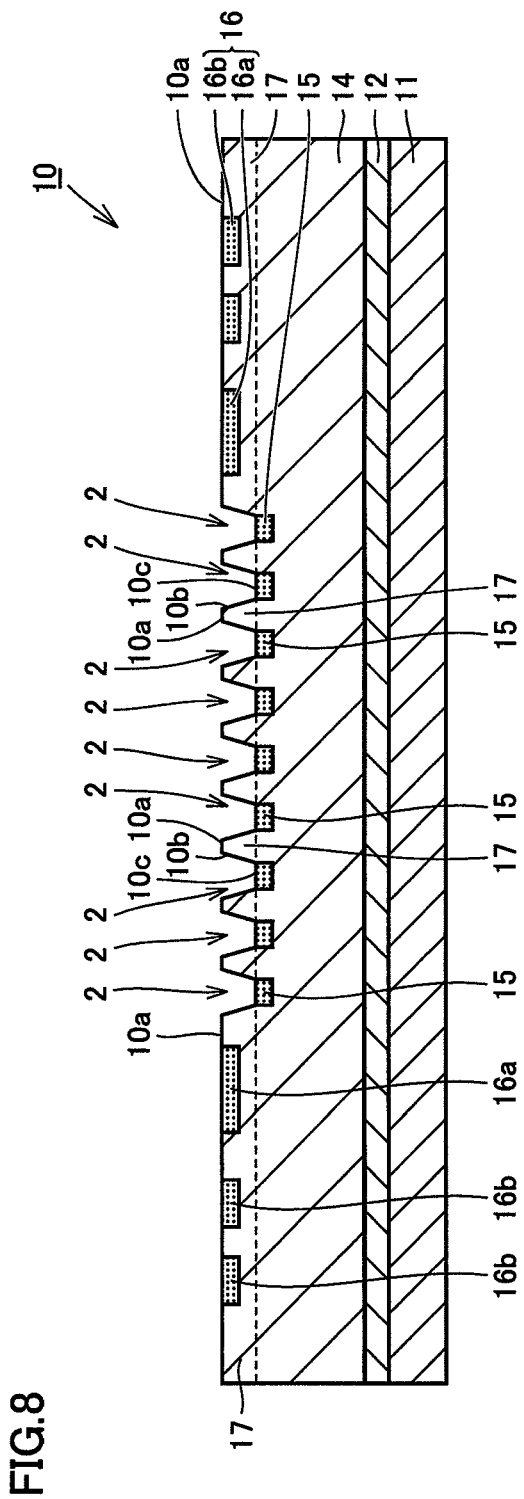
FIG. 8 is a sectional view schematically representing a fifth step in the method for manufacturing the wide gap semiconductor device according to the first embodiment of the present invention.
Figure 9:
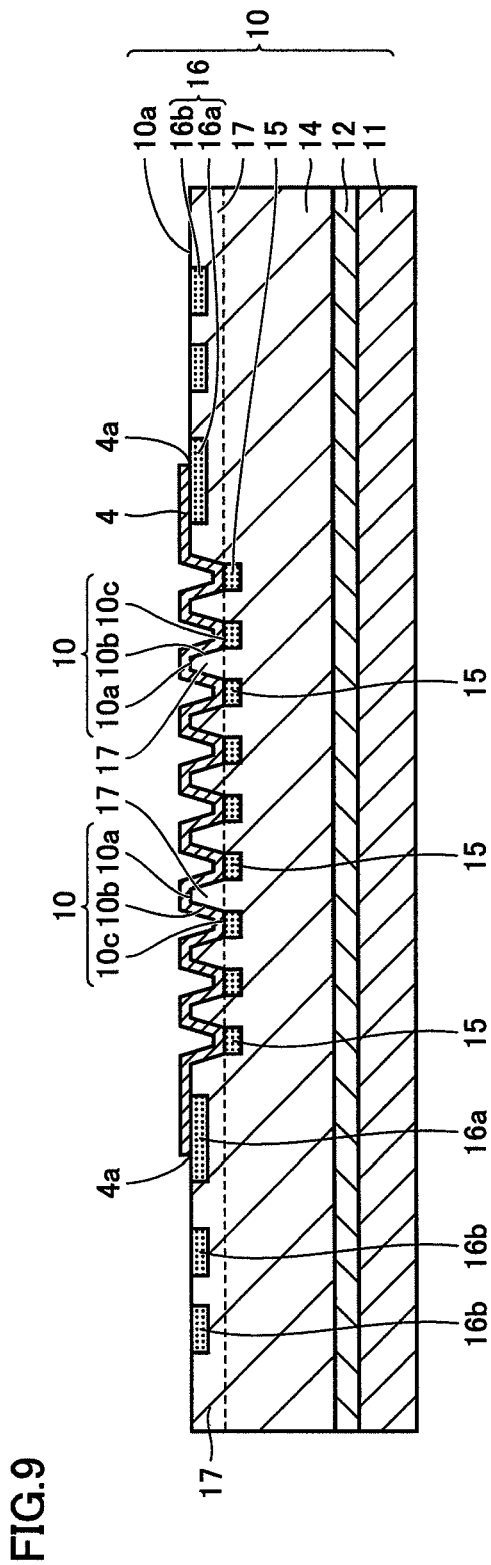
FIG. 9 is a sectional view schematically representing a sixth step in the method for manufacturing the wide gap semiconductor device according to the first embodiment of the present invention.

At main face 10a of substrate 10, a plurality of trenches 2 (refer to FIG. 8) are formed. Referring to FIGS. 2 and 8, trench 2 includes a side face 10b continuous with main face 10a and a bottom 10c continuous with side face 10b. Schottky electrode 4 adjoins n type region 17 (first-conductivity-type region) at side face 10b of trench 2 and main face 10a, and adjoins p type region 15 (second-conductivity-type region) at bottom 10c of trench 2. Side face 10b of trench 2 is inclined relative to main face 10a of substrate 10. Preferably, the angle θ of main face 10a to the side face is smaller than 90°. Preferably, the angle θ of main face 10a to the side face is greater than or equal to 50° and less than or equal to 85°. A pad electrode 60 forms contact with Schottky electrode 4 in trench 2. P type region 16a adjoins Schottky electrode 4 and a protection film 70 formed of an insulator at main face 10a. Bottom 10c of trench 2 may be planar or linear. In the case where bottom 10c is linear, the two side faces 10b facing each other adjoin at bottom 10c, so that trench 2 takes a V shape in the view of FIG. 1.

Referring to FIG. 1, JTE region 16 is a p type region having impurities such as aluminium (Al) or boron (B) ions implanted. The impurity concentration of this p type region is approximately $2 \times 10^{17}$ cm$^{-3}$, for example. JTE region 16 includes a p type region 16a in contact with an outer circumference 4a of Schottky electrode 4, and a p type region 16b arranged at the outer circumferential side of p type region 16a and not in contact with Schottky electrode 4. Substrate 10 may have a field stop region (not shown) so as to surround JTE region 16. The field stop region is an n$^+$ type region having ions such as phosphorus (P) implanted.

Schottky electrode 4 is formed of titanium (Ti), for example. For Schottky electrode 4, nickel (Ni), titanium nitride (TiN), gold (Au), molybdenum (Mo), tungsten (W), and the like may be employed besides titanium. The area of contact between Schottky electrode 4 and p type region 15 is approximately 50% the area of contact between Schottky electrode 4 and substrate 10.

Referring to FIG. 1, pad electrode 60 is formed adjoining Schottky electrode 4. Pad electrode 60 is formed of aluminium, for example. A protection film 70 is formed adjoining pad electrode 60, Schottky electrode 4, and main face 10a of substrate 10. Further, an ohmic electrode 30 is arranged adjoining n$^+$ substrate 11. Ohmic electrode 30 is foamed of nickel, for example. Moreover, a pad electrode 40 formed of titanium, nickel, silver, or alloy thereof, for example, is arranged adjoining ohmic electrode 30.

A method for manufacturing a Schottky barrier diode that is a wide gap semiconductor device according to an embodiment of the present invention will be described hereinafter with reference to FIGS. 3-9.

Figure 3:
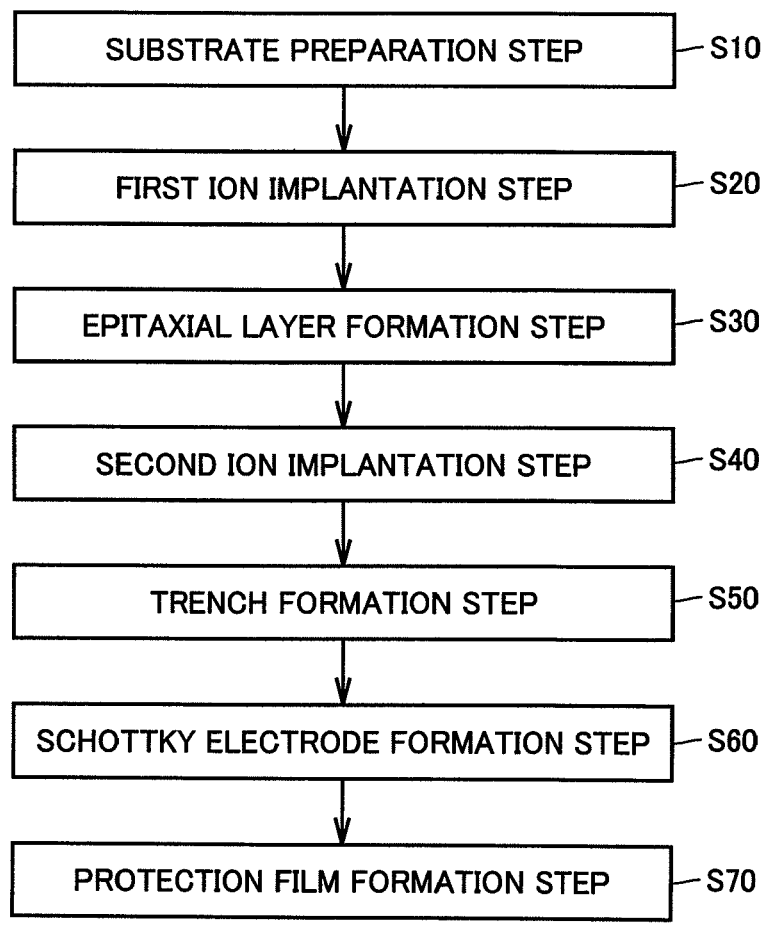
FIG. 3 is a flowchart schematically representing a method for manufacturing a wide gap semiconductor device according to the first embodiment of the present invention.
Figure 4:
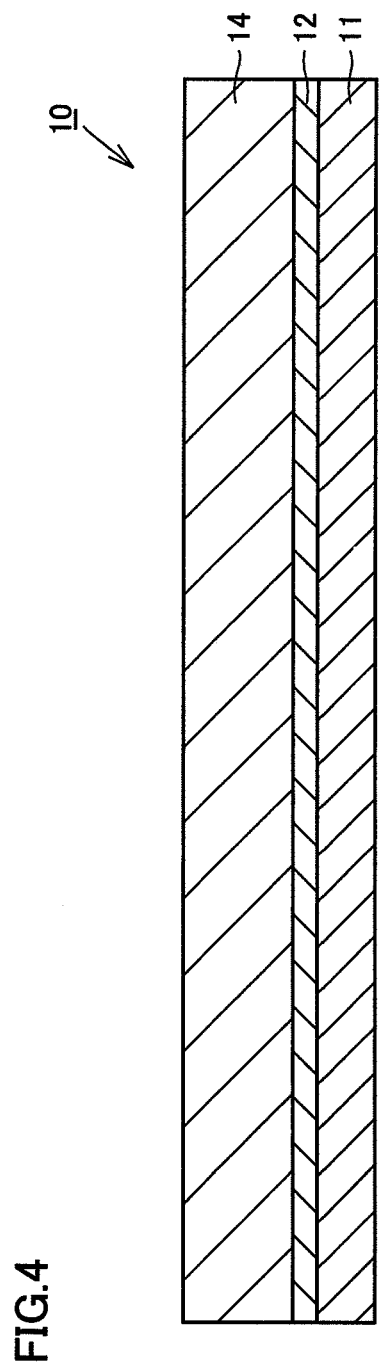
FIG. 4 is a sectional view schematically representing a first step in the method for manufacturing the wide gap semiconductor device according to the first embodiment of the present invention.

Referring to FIG. 4, a substrate preparation step is performed as step S10 (FIG. 3). At step S10, an n$^+$ substrate 11 having n type conductivity (first conductivity type) is prepared by slicing an ingot (not shown) formed of single crystal silicon carbide that is the 4H polytype, for example. The N$^+$ substrate contains impurities such as nitrogen (N). The impurity concentration of the n$^+$ substrate is approximately $5 \times 10^{18}$ cm$^{-3}$, for example.

Then, electric field termination layer 12 is formed on n$^+$ substrate 11. Electric field termination layer 12 is a silicon carbide layer of n type. The impurity concentration of phosphorus or the like included in electric field termination layer 12 is greater than or equal to approximately $5 \times 10^{17}$ cm$^{-3}$ and less than or equal to approximately $1 \times 10^{18}$ cm$^{-3}$, for example. Then, n type region 14 of n type conductivity (first conductivity type) is formed by epitaxial growth on electric field termination layer 12. Accordingly, substrate 10 of the first conductivity type formed of a wide gap semiconductor material is prepared.

Figure 5:
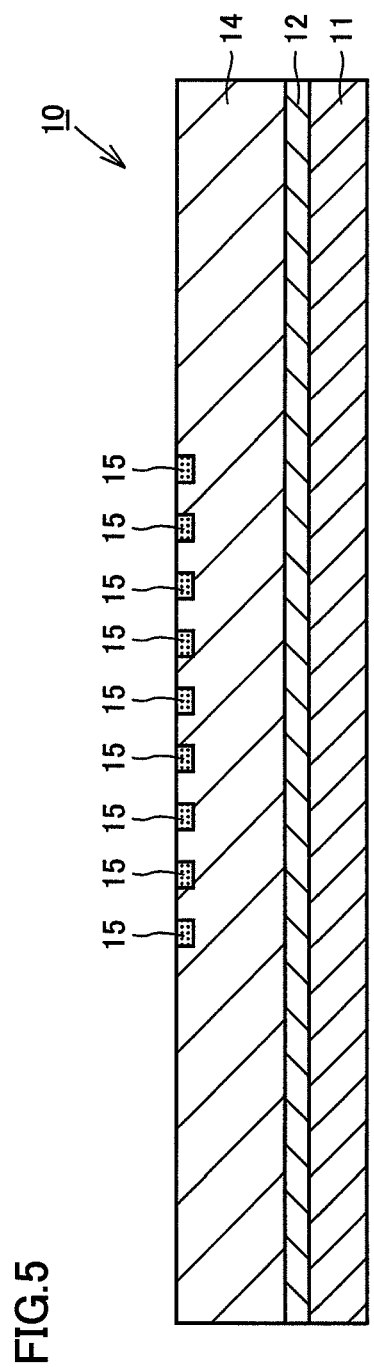
FIG. 5 is a sectional view schematically representing a second step in the method for manufacturing the wide gap semiconductor device according to the first embodiment of the present invention.

Then, a first ion implantation step is performed as step S20 (FIG. 3). At this step S20, a mask formed of silicon dioxide having an opening corresponding to the region where p type region 15 is to be formed is provided on substrate 10, as shown in FIG. 5. Then, aluminium (Al) ions, for example, are implanted into n type region 14 to form p type region 15 of p type conductivity (second conductivity type). The impurity concentration of p type region 15 is approximately $1 \times 10^{19}$ cm$^{-3}$, for example.

Figure 6:
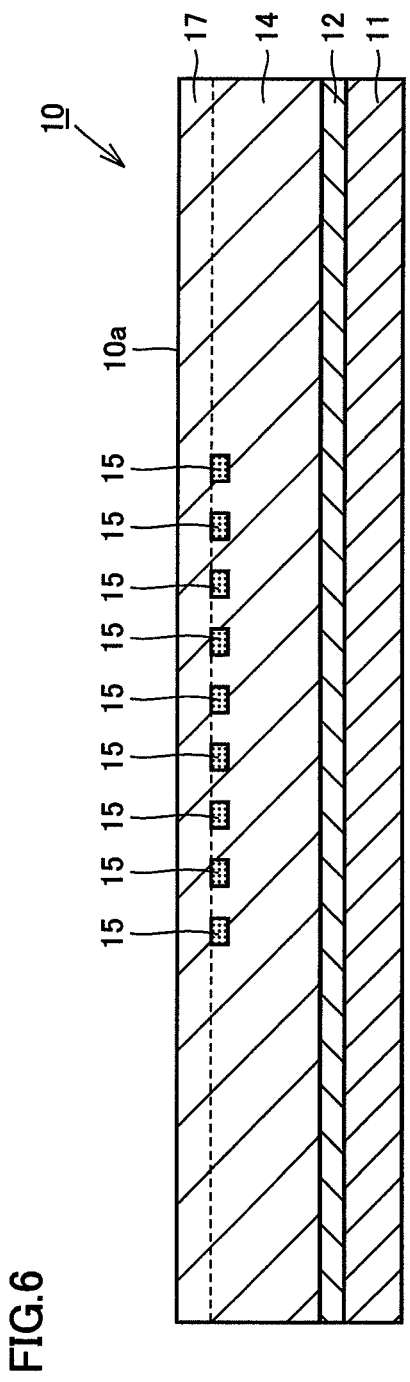
FIG. 6 is a sectional view schematically representing a third step in the method for manufacturing the wide gap semiconductor device according to the first embodiment of the present invention.

For step S30 (FIG. 3), an epitaxial layer formation step is performed. At step S30, an n type region 17 is formed by epitaxial growth so as to adjoin p type region 15 and n type region 14, as shown in FIG. 6. The impurity concentration of n type region 17 is approximately $1 \times 10^{16}$ cm$^{-3}$, for example. Thus, there is prepared substrate 10 of a wide gap semiconductor material, having main face 10a, and including n type region 17 (first-conductivity-type region) and p type region 15 (second-conductivity-type region).

Figure 7:
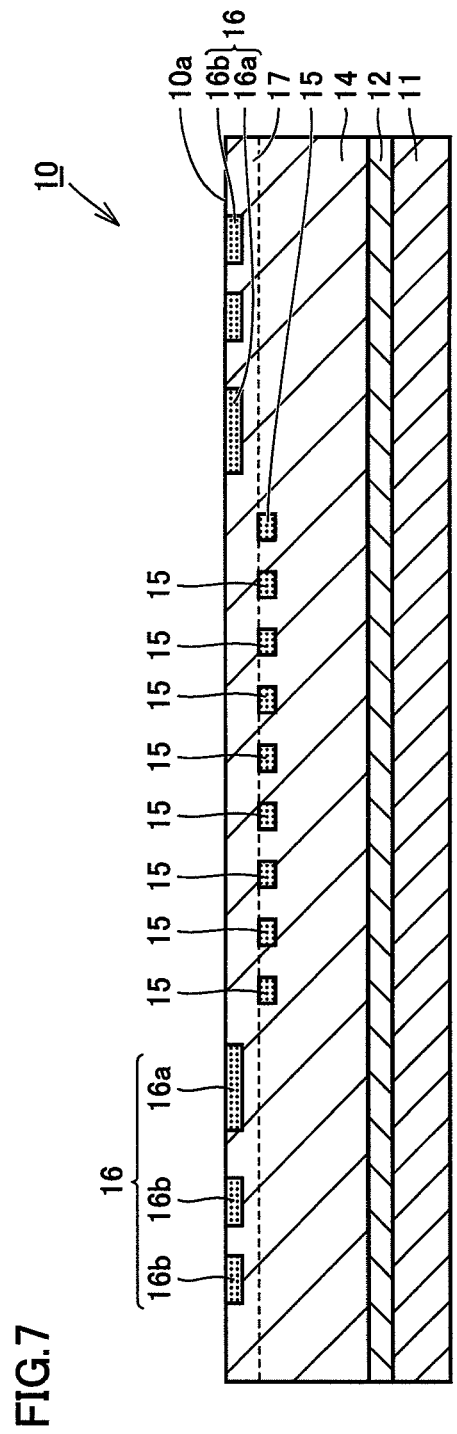
FIG. 7 is a sectional view schematically representing a fourth step in the method for manufacturing the wide gap semiconductor device according to the first embodiment of the present invention.

For step S40 (FIG. 3), a second ion implantation step is performed. At step S40, a mask formed of silicon dioxide having an opening corresponding to the region where JTE region 16 is to be formed is provided on substrate 10, as shown in FIG. 7. Then, aluminium (Al) ions, for example, are implanted into n type region 17 to form JTE region 16 of p type conductivity (second conductivity type). JTE region 16 may include a plurality of p type regions 16a and 16b. The impurity concentration of JTE region 16 is approximately $2 \times 10^{17}$ cm$^{-3}$, for example.

For step S50 (FIG. 3), a trench formation step is performed. Specifically, a mask formed of silicon dioxide is provided at the substrate. Then, by carrying out inductive coupled plasma reactive ion etching (ICP-RIE) using SF$_6$ or mixture gas of SF$_6$ and O$_2$ as the reaction gas, a recess having a sidewall extending substantially along the thickness direction (vertical direction in the drawing) of n type region 17 is formed. The recess is subjected to thermal etching. Thermal etching may be implemented by heating in an atmosphere including reactive gas containing at least one type of halogen atom, for example. The at least one type of halogen atom includes at least chlorine (Cl) atom or fluorine (F) atom. The atmosphere is Cl$_2$, SF$_6$, or CF$_4$, for example. For example, thermal etching is carried out using mixture gas of chlorine gas and oxygen gas as the reaction gas, at a thermal treatment temperature greater than or equal to 700° C. and less than or equal to 1000° C., for example. Thus, a trench 2 having side face 10b continuous with main face 10a and bottom 10c continuous with side face 10b is framed at main face 10a of substrate 10 (refer to FIG. 8).

The reaction gas may include carrier gas in addition to the aforementioned chlorine gas and oxygen gas. For carrier gas, nitrogen (N2) gas, argon gas, helium gas, and the like can be employed. When the thermal treatment is set at a temperature greater than or equal to 700° C. and less than or equal to 1000° C., the SiC etching rate becomes approximately 70 μm/hour, for example. Moreover, trench 2 is formed such that side face 10b of trench 2 is inclined relative to main face 10a of substrate 10. The angle θ of main face 10a relative to side face 10b (refer to FIG. 2) is preferably greater than or equal to 50° and less than or equal to 85°.

Then, activation annealing is performed. Specifically, substrate 10 is heated at the temperature of approximately 1800° C. in an inert gas atmosphere such as argon. Accordingly, the impurities introduced by the first ion implantation step (S20) and the second ion implantation step (S40) are activated to produce the desired carrier.

For step S60 (FIG. 3), a Schottky electrode formation step is performed. Specifically, referring to FIG. 8, Schottky electrode 4 is formed, adjoining main face 10a of substrate 10, side face 10b, and bottom 10e of trench 2. In more detail, Schottky electrode 4 is formed adjoining n type region 17 at main face 10a of substrate 10 and side face 10b, and adjoining p type region 15 at bottom 10c. Schottky electrode 4 is a metal film such as of titanium (Ti), nickel (Ni), molybdenum (Mo), tungsten (W), and titanium nitride (TiN). Following the formation of the metal film such as by sputtering, Schottky electrode 4 is heated by annealing. Then, pad electrode 60 formed of aluminium, for example, is provided on and in contact with Schottky electrode 4.

Preferably, Schottky electrode 4 is formed such that outer circumference 4a of Schottky electrode 4 adjoins p type region 16a formed at substrate 10. P type region 16a is where impurities such as aluminium (Al) or boron (B) ions are implanted. The impurity concentration of p type region 16a is approximately $2 \times 10^{17}$ cm$^{-3}$, for example.

For step S70 (FIG. 3), a protection film formation step is performed. Specifically, referring to FIG. 9, protection film 70 is formed adjoining pad electrode 60, Schottky electrode 4, and main face 10a of substrate 10.

Then, an ohmic electrode formation step is performed. Specifically, the face (back side) opposite to main face 10a of substrate 10 is ground, and ohmic electrode 30 formed of nickel, for example, is provided in contact with the back face. Then, pad electrode 40 formed of titanium, nickel, silver, or alloy thereof, for example, is provided adjoining ohmic electrode 30. Thus, Schottky barrier diode 1 is completed as the wide gap semiconductor device shown in FIG. 1.

Although the present embodiment has been described with the first conductivity type as the n type and the second conductivity type as a p type, the first conductivity type may be the p type and the second conductivity type may be the n type. Furthermore, the present invention has been described based on, but not limited to the example of a Schottky barrier diode as the wide gap semiconductor device in the present embodiment. The wide gap semiconductor device may be a transistor having a Schottky junction, for example a metal semiconductor field effect transistor (MESFET) or a high electron mobility transistor (HEMT).

The functional advantage of Schottky barrier diode 1 and manufacturing method therefor according to the first embodiment will be described hereinafter.

According to Schottky barrier diode 1 of the present embodiment, Schottky electrode 4 adjoins n type region 17 at side face 10b of trench 2 and main face 10a, and adjoins p type region 15 at bottom 10c of trench 2. Accordingly, by increasing the electric field at the p type region during application of backward voltage, the electric field at the interface between Schottky electrode 4 and n type region 17 can be alleviated.

According to Schottky barrier diode 1 of the present embodiment, side face 10b of trench 2 is inclined relative to main face 10a of substrate 10. Accordingly, the area of contact between Schottky electrode 4 and n type region 17 can be increased as compared to the case where side face 10b of trench 2 is parallel to main face 10a. As a result, a current path can be ensured since the surface utilization percentage of electron emission during application of forward voltage is increased.

Furthermore, the wide gap semiconductor material for Schottky barrier diode 1 of the present embodiment is silicon carbide. Therefore, a Schottky barrier diode 1 having high breakdown voltage can be obtained.

According to Schottky barrier diode 1 of the present embodiment, the angle of main face 10a relative to side face 10b is greater than or equal to 50° and less than or equal to 85°. In the case where the angle of main face 10a relative to side face 10b is smaller than 50°, the effect of alleviating the electric field at the interface between Schottky electrode 4 and n type region 17 becomes smaller. In the case where the angle of main face 10a relative to side face 10b is greater than 85°, a sufficient current path cannot be ensured. By setting the angle of main face 10a relative to side face 10b greater than or equal to 50° and less than or equal to 85°, the effect of alleviating the electric field at the interface between Schottky electrode 4 and n type region 17 can be improved and a sufficient current path can be ensured.

Furthermore, according to Schottky barrier diode 1 of the present embodiment, substrate 10 includes p type region 16a adjoining outer circumference 4a of Schottky electrode 4. Accordingly, the electric field concentration at outer circumference 4a of Schottky electrode 4 can be alleviated.

According to the method for manufacturing Schottky barrier diode 1 of the present embodiment, the Schottky electrode adjoins n type region 17 at side face 10b of trench 2 and main face 10a, and adjoins p type region 15 at bottom 10c of trench 2. Accordingly, by increasing the electric field of p type region 15 during application of backward voltage, the electric field at the interface between Schottky electrode 4 and n type region 17 can be alleviated.

According to the method for manufacturing Schottky barrier diode 1 of the present embodiment, side face 10b of trench 2 is inclined relative to main face 10a of substrate 10. Accordingly, the area of contact between Schottky electrode 4 and n type region 17 can be increased, as compared to the case where side face 10b of trench 2 is parallel to main face 10a of substrate 10. As a result, a current path can be ensured since the surface utilization percentage of electron emission during application of forward voltage is increased.

Furthermore, according to the method for manufacturing Schottky barrier diode 1 of the present embodiment, the step of forming trench 2 is performed by thermal etching. Accordingly, the damage at side face 10b of trench 2 can be eliminated.

[Second Embodiment]

A configuration of Schottky barrier diode 1 that is a wide gap semiconductor device according to a second embodiment of the present invention will be described with reference to FIG. 10. Schottky barrier diode 1 of the second embodiment differs from Schottky barrier diode 1 of the first embodiment in that there is provided a first p type region 16a adjoining Schottky electrode 4 and a second p type region 16b not adjoining Schottky electrode 4. The remaining elements are similar to those of Schottky barrier diode 1 of the first embodiment.

Figure 10:
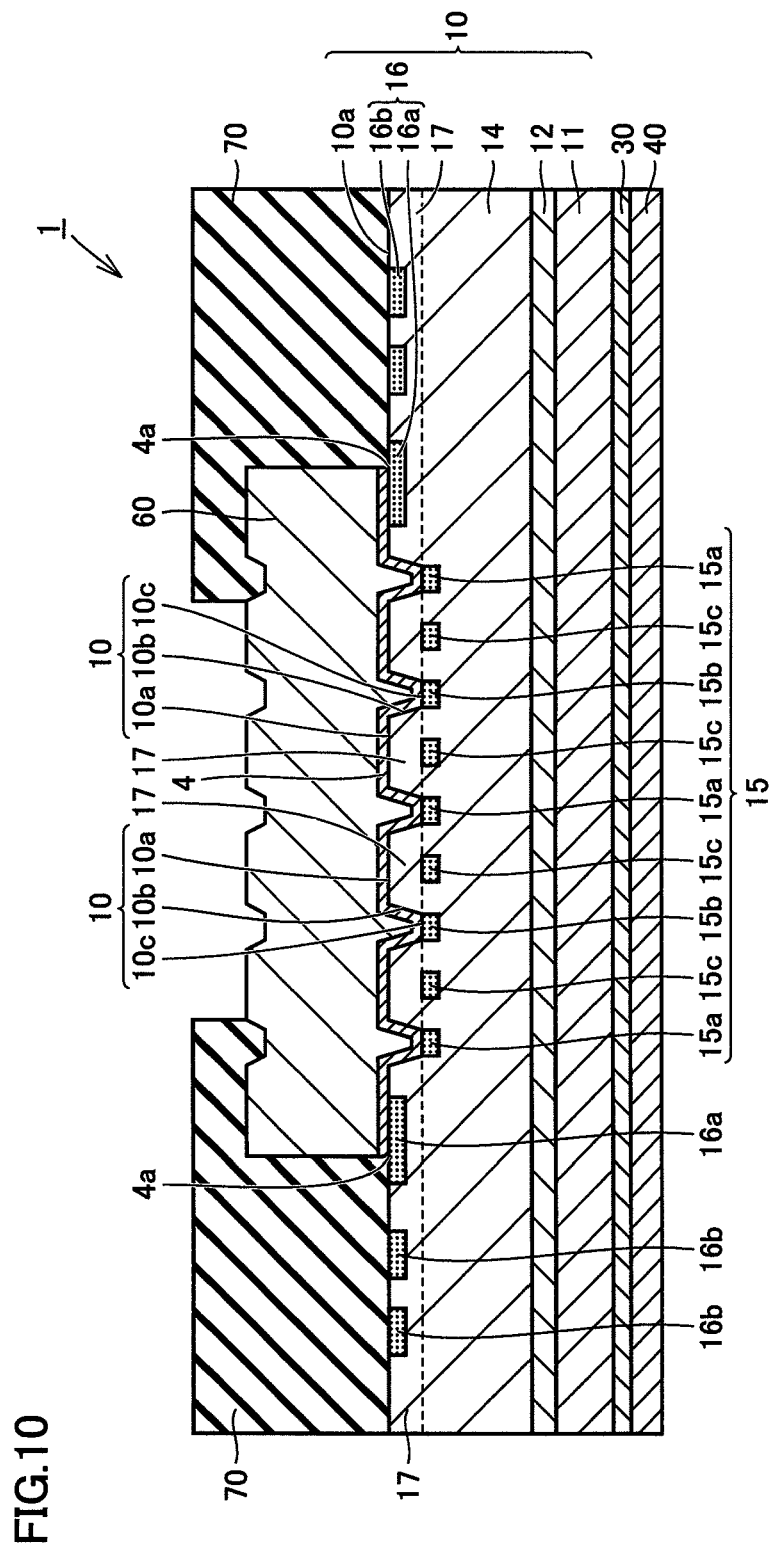
FIG. 10 is a sectional view schematically representing a configuration of a wide gap semiconductor device according to a second embodiment of the present invention.
Figure 11:
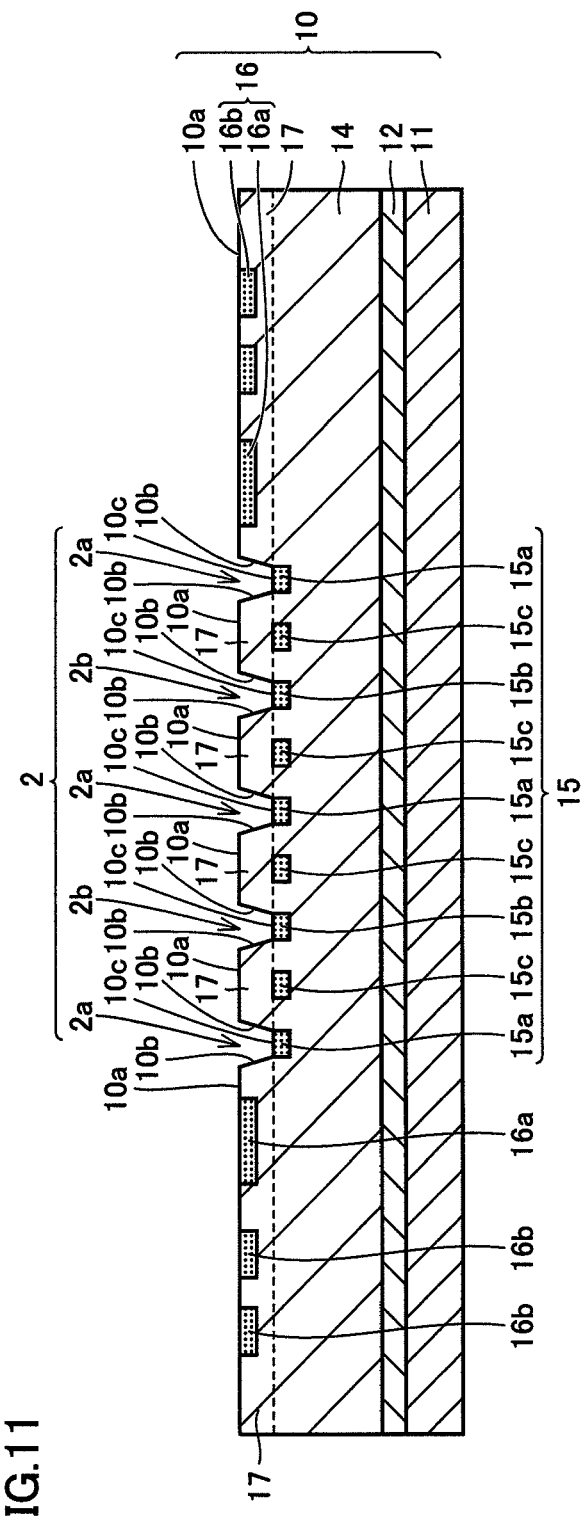
FIG. 11 is a sectional view schematically representing a fifth step in the method for manufacturing the wide gap semiconductor device according to the second embodiment of the present invention.

Referring to FIGS. 10 and 11, Schottky barrier diode 1 of the second embodiment includes a first trench 2a and a second trench 2b adjacent to each other. P type region 15 includes a first p type region 15a (first second-conductivity-type region) adjoining bottom 10c of first trench 2a, a second p type region 15b (second second-conductivity-type region) adjoining bottom 10c of second trench 2b, and a third p type region 15c (third second-conductivity-type region) arranged between first p type region 15a and second p type region 15b. Each of first p type region 15a and second p type region 15b form contact with Schottky electrode 4 at the bottom. Third p type region 15c does not form contact with Schottky electrode 4. Third p type region 15c is arranged around the middle of first p type region 15a and second p type region 15b.

A method for manufacturing Schottky barrier diode 1 that is a wide gap semiconductor device according to the second embodiment of the present invention will be described.

Steps similar to those described in the first embodiment are performed to prepare substrate 10 shown in FIG. 7. Then, trench 2 is formed through a step similar to trench formation step S50 described in the first embodiment. As compared to the first embodiment in which trench 2 is formed such that the surface of all p type regions 15 is exposed at bottom 10c of trench 2, trench 2 of the second embodiment is formed to provide first and second p type regions 15a and 15b having the surface exposed at bottom 10c of trench 2, and a third p type region 15c having the surface not exposed at bottom 10c of trench 2.

Figure 12:
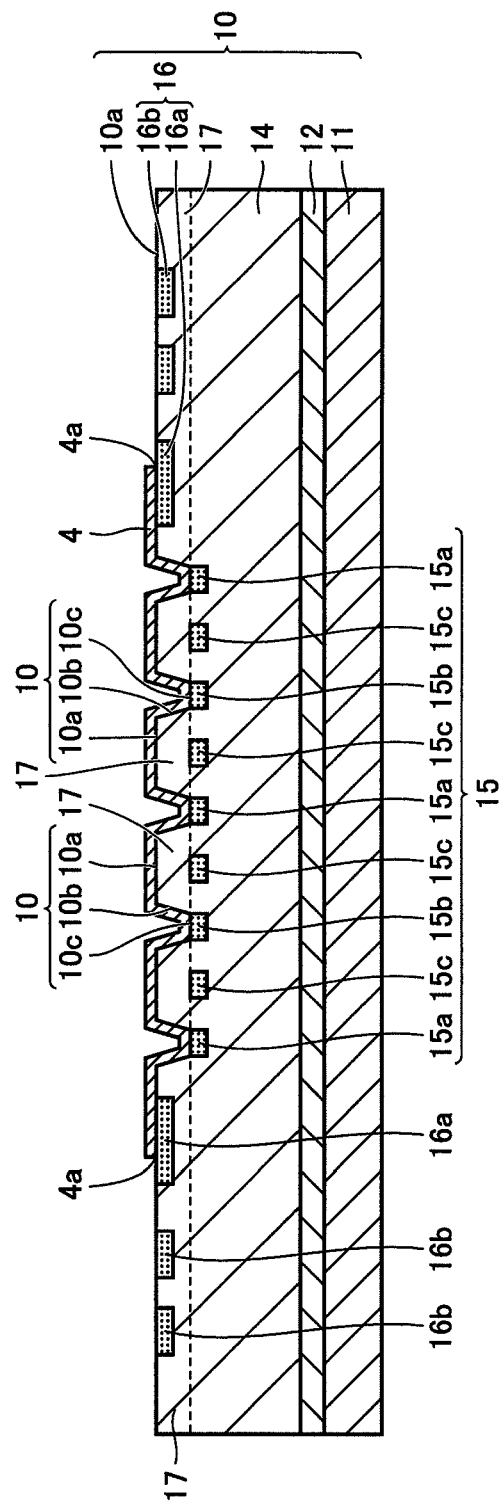
FIG. 12 is a sectional view schematically representing a sixth step in the method for manufacturing the wide gap semiconductor device according to the second embodiment of the present invention.

Referring to FIG. 12, Schottky electrode 4 is foamed through a step similar to Schottky electrode formation step S60 described in the first embodiment. Specifically, Schottky electrode 4 is formed, adjoining n type region 17 at main face 10a of substrate 10 and side face 10b, and adjoining p type region 15a at bottom 10c. Schottky electrode 4 forms contact with p type regions 15a and 15b having the surface exposed at bottom 10c, but does not form contact with p type region 15c having the surface not exposed at bottom 10c.

Then, through steps similar to those described in the first embodiment, pad electrode 60, protection film 70, ohmic electrode 30 and pad electrode 40 are formed to complete Schottky barrier diode 1 as the wide gap semiconductor device shown in FIG. 10.

According to Schottky barrier diode 1 of the present embodiment, trench 2 includes first trench 2a and second trench 2b adjacent to each other. P type region 15 includes first p type region 15a adjoining bottom 10c of first trench 2a, second p type region 15b adjoining bottom 10c of second trench 2b, and third p type region 15c arranged between first p type region 15a and second p type region 15b. Accordingly, the electric field at the interface between Schottky electrode 4 and n type region 17 can be alleviated effectively even when the distance between first trench 2a and second trench 2b cannot be reduced.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A wide gap semiconductor device comprising:
   a substrate formed of a wide gap semiconductor material, having a main face, and including a first-conductivity-type region and a second-conductivity-type region, and
   a Schottky electrode arranged adjoining said main face of said substrate,
   said substrate having a trench formed, said trench including a side face continuous with said main face, and a bottom continuous with said side face,
   said Schottky electrode adjoining said first-conductivity-type region at said side face of said trench and said main face, and adjoining said second-conductivity-type region at said bottom of said trench,
   said side face of said trench inclined relative to said main face of said substrate.

2. The wide gap semiconductor device according to claim 1, wherein said wide gap semiconductor material includes silicon carbide.

3. The wide gap semiconductor device according to claim 1, wherein an angle of said main face relative to said side face is greater than or equal to 50° and less than or equal to 85°.

4. The wide gap semiconductor device according to claim 1, wherein
   said trench includes a first trench and a second trench adjacent to each other,
   said second-conductivity-type region includes a first second-conductivity-type region adjoining a bottom of said first trench, a second second-conductivity-type region adjoining a bottom of said second trench, and a third second-conductivity-type region arranged between said first second-conductivity-type region and said second second-conductivity-type region.

5. The wide gap semiconductor device according to claim 1, wherein said substrate includes a fourth second-conductivity-type region adjoining an outer circumference of said Schottky electrode.

\* \* \* \* \*